(12) United States Patent
Mukhopadhyay

(10) Patent No.: US 11,809,745 B2
(45) Date of Patent: Nov. 7, 2023

(54) MULTI-FETCHING DATA FOR MULTI-PASS PROGRAMMING WITHIN STORAGE DEVICES

(71) Applicant: Western Digital Technologies, Inc., San Jose, CA (US)

(72) Inventor: Rishi Mukhopadhyay, Bangalore (IN)

(73) Assignee: Western Digital Technologies, Inc., San Jose, CA (US)

(*) Notice: Subject to any disclaimer, the term of this patent is extended or adjusted under 35 U.S.C. 154(b) by 8 days.

(21) Appl. No.: 17/319,605

(22) Filed: May 13, 2021

(65) Prior Publication Data

US 2022/0365717 A1 Nov. 17, 2022

(51) Int. Cl.
*G06F 3/06* (2006.01)

(52) U.S. Cl.
CPC .......... *G06F 3/0659* (2013.01); *G06F 3/0613* (2013.01); *G06F 3/0688* (2013.01)

(58) Field of Classification Search
CPC ..... G06F 3/0659; G06F 3/0613; G06F 3/0688
See application file for complete search history.

(56) References Cited

U.S. PATENT DOCUMENTS

| | | | |
|---|---|---|---|
| 6,141,715 A * | 10/2000 | Porterfield | .......... G06F 13/4036 711/146 |
| 9,824,761 B2 | 11/2017 | Kwak et al. | |
| 9,870,169 B2 | 1/2018 | Ramalingam et al. | |
| 10,114,586 B1 | 10/2018 | Benisty et al. | |
| 10,275,378 B2 | 4/2019 | Benisty | |
| 2012/0106246 A1* | 5/2012 | Nawata | ................... G11C 16/10 365/185.24 |
| 2019/0088340 A1* | 3/2019 | Shirakawa | .......... G11C 11/5628 |
| 2020/0241799 A1 | 7/2020 | Kanno | |
| 2021/0223962 A1* | 7/2021 | Esaka | ...................... G06F 3/061 |
| 2021/0272639 A1* | 9/2021 | Dhotre | .................... G06F 9/542 |
| 2022/0262441 A1* | 8/2022 | Kanamori | .......... G11C 16/3404 |

* cited by examiner

*Primary Examiner* — Eric Cardwell
(74) *Attorney, Agent, or Firm* — Ravi Mohan; Rutan & Tucker, LLP

(57) ABSTRACT

Storage devices include a memory array comprised of a plurality of memory devices. As memory array density increases, multi-pass programming is utilized to reduce negative effects to neighboring memory devices. The use of multi-pass programming requires longer access to the data being programmed. To avoid adding additional lower density or controller memory, data within a host memory is accessed multiple times as needed to provide pieces of data to the memory array, which is configured to comply with the utilized multi-pass programming method. The expected order of the multi-pass programming method can be determined to generate one or more memory pipeline instruction processing queues to direct the components of the storage device memory pipeline to access, re-access, and process the host data in a specific order necessary for delivery to the memory array to comply with the utilized multi-pass programming method.

18 Claims, 12 Drawing Sheets

| WL# | PROGRAM STAGE | PROGRAM ORDER | | | |
|---|---|---|---|---|---|
| | | STRING 0 | STRING 1 | STRING 2 | STRING 3 |
| WL0 | FOGGY | 0 | 1 | 2 | 3 |
| | FINE | 5 | 7 | 9 | 11 |
| WL1 | FOGGY | 4 | 6 | 8 | 10 |
| | FINE | 13 | 15 | 17 | 19 |
| WL2 | FOGGY | 12 | 14 | 16 | 18 |
| | FINE | 21 | 23 | 25 | 27 |
| WL3 | FOGGY | 20 | 22 | 24 | 26 |
| | ... | ... | ... | ... | ... |
| WL93 | FINE | 749 | 751 | 753 | 755 |
| WL94 | FOGGY | 748 | 750 | 752 | 754 |
| | FINE | 757 | 759 | 761 | 763 |
| WL95 | FOGGY | 756 | 758 | 760 | 762 |
| | FINE | 764 | 765 | 766 | 767 |

*FIG. 6*

MULTI-FETCHING DATA FOR MULTI-PASS PROGRAMMING WITHIN STORAGE DEVICES

FIELD

The present disclosure relates to storage systems. More particularly, the present disclosure relates to generating memory access queues that access data as many times as needed to comply with multi-pass programming methods to reduce hardware costs and requirements.

BACKGROUND

Storage devices are ubiquitous within computing systems. Solid-state storage devices have become increasingly common. These nonvolatile storage devices can communicate and utilize various protocols including non-volatile memory express (NVMe), and peripheral component interconnect express (PCIe) to reduce processing overhead and increase efficiency.

Over time the complexity and density of the memory devices utilized in the solid-state storage devices have introduced problems that must be worked around. Memory devices that can store higher densities of data and/or that are packed closely together may suffer from a Yupin effect that alters a pre-written value to one memory device when a nearby memory device is written to. In order to minimize this effect, many memory arrays program their data in multi-pass programming methods that both program each memory device over smaller steps and vary the location of data writing to minimize changes done to neighboring memory devices.

One result of this multi-pass programming method is that the data to be written must be somehow available to the memory array for an extended period of time to allow for programming over multiple passes. This problem has been mitigated previously through the use of folding data wherein the data to be written to the memory array is first written to a lower density array of memory devices (less susceptible to these negative effects) which may then copy the data to the higher density memory devices once available. Other traditional methods temporarily utilize a portion of the random access memory (RAM) section available to the storage device controller to hold the data until all passes of the multi-pass programming are completed. However, as the capacity and complexity of storage devices increase, the costs of adding additional controller RAM and/or providing an expanded low-density memory array become prohibitive.

BRIEF DESCRIPTION OF DRAWINGS

The above, and other, aspects, features, and advantages of several embodiments of the present disclosure will be more apparent from the following description as presented in conjunction with the following several figures of the drawings.

FIG. 6 is a conceptual illustration of a staggered foggy/fine multi-pass programming order within a series of word lines with multiple strings in accordance with an embodiment of the disclosure;

Figure 1:
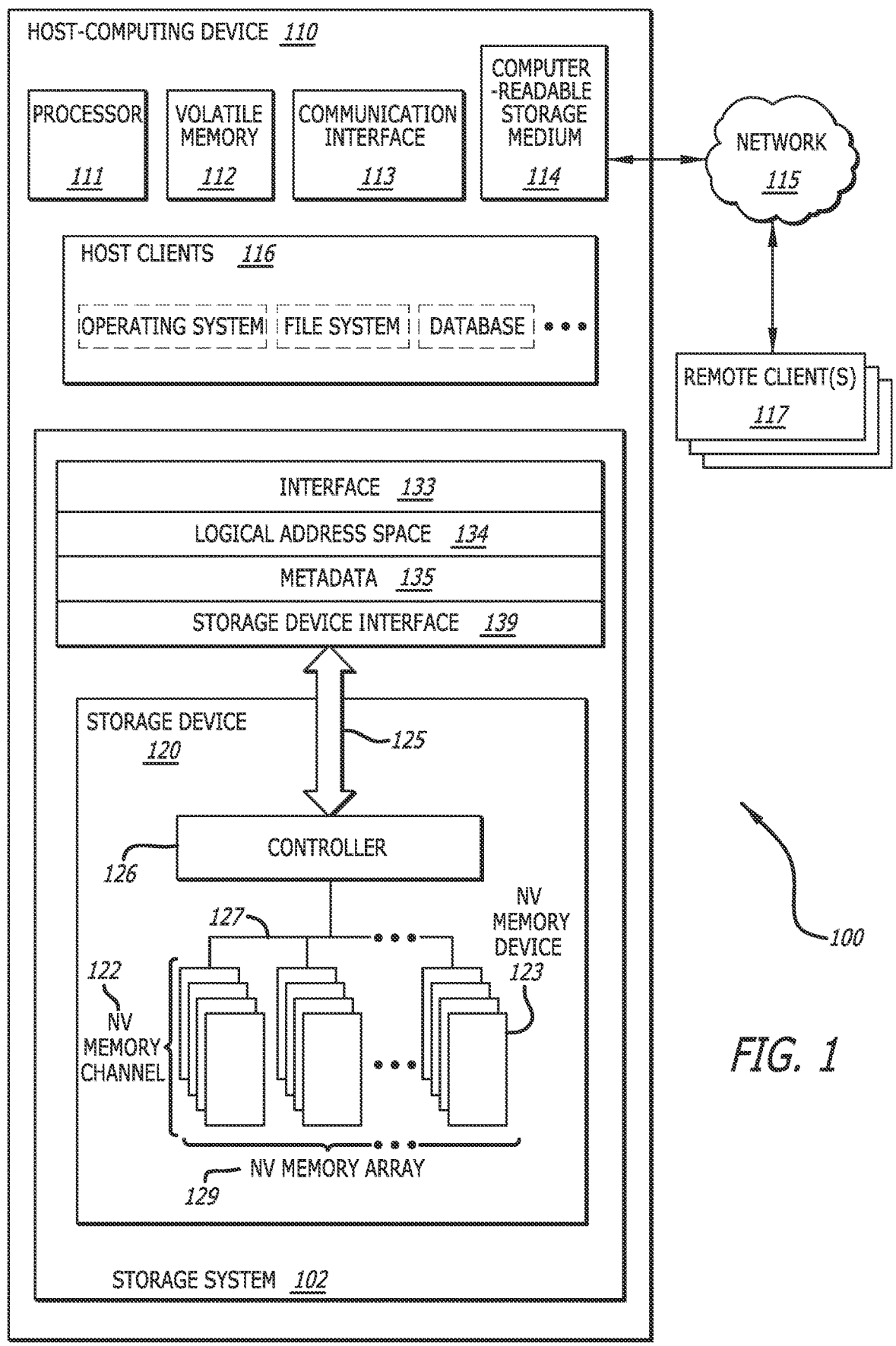
FIG. 1 is schematic block diagram of a host-computing device with a storage device suitable for write abort detections in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that utilize a series of processes to access data multiple times as needed to conform with a given multi-pass programming method. In many embodiments, the storage device can determine what the expected multi-pass programming pattern will be for the available memory array. Once determined, the required data can be accessed in steps that can be processed through the memory pipeline and presented to the memory array for storage such that each piece of data presented to the memory array is configured to be associated with the next multi-pass programming step within the memory array. In this way, data may be accessed multiple times during the writing process.

Unlike traditional methods, the data to be written (typically from a host computing device) resides within the host device and/or buffer. The data is accessed multiple times as needed for the multi-pass programming method being utilized by the memory array. In this way, the storage device may avoid having to provide a larger intermediate storage space within the controller ram or a low-density memory array. As processing data through an internal data pipeline becomes faster and more trivial, the benefits of avoiding adding additional memory devices to the storage device outweigh the potential cost of re-accessing and reprocessing data.

As shown in more detail within the figures below, the process of re-accessing pieces of data as needed to conform with a given multi-pass programming routine can be accomplished through the use of one or more generated a memory pipeline instruction processing queues. The memory pipeline instruction processing queue can direct one or more components within the memory processing pipeline of a storage device to process specific pieces of data that are available (via host access/DMA, or an available buffer memory). The specific order can be configured to match accessing data provided for storage to the steps required for multi-pass programming of the memory array. In this way, the memory pipeline components can be directed to access the host multiple times as needed until all data has been written. It would be understood by those skilled in the art that for a given multi-pass programming method, the number of times data is accessed would match the number of passes which are required within the multi-pass programming method.

In a number of embodiments, the use of the memory pipeline instruction processing queues can scale based on the type and number of memory arrays available as well as the number of data bus connections to the host. In these embodiments, one or more additional memory pipeline instruction processing queues are generated and utilized within the storage device to facilitate the moving of increased amounts of data. Often, the increase in memory arrays available is due to an increased memory die parallelism in newer storage devices. Often, multiple memory pipeline instruction processing queues are provided to a single or lower number of memory pipeline components. In some embodiments, the processing of these multiple queues is accomplished by utilizing simple scheduler system such as, but not limited to, a round-robin scheduling system.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for pre-erase list usage in accordance with an embodiment of the disclosure is shown. The control block management system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a communication network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer-readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote clients 117 accessible via the network 115 and/or communication interface 113. The host clients 116 may include, but are not limited to: operating systems, file systems, database applications, server applications, kernel-level processes, user-level processes, applications, and the like.

In many embodiments, the host-computing device 110 can include a plurality of virtual machines which may be instantiated or otherwise created based on user-request. As will be understood by those skilled in the art, a host-computing device 110 may create a plurality of virtual machines configured as virtual hosts which is limited only on the available computing resources and/or demand. A hypervisor can be available to create, run, and otherwise manage the plurality of virtual machines. Each virtual machine may include a plurality of virtual host clients similar to host clients 116 that may utilize the storage system 102 to store and access data.

The device driver nay be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote clients 117 (which can act as another host). The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

Figure 2:
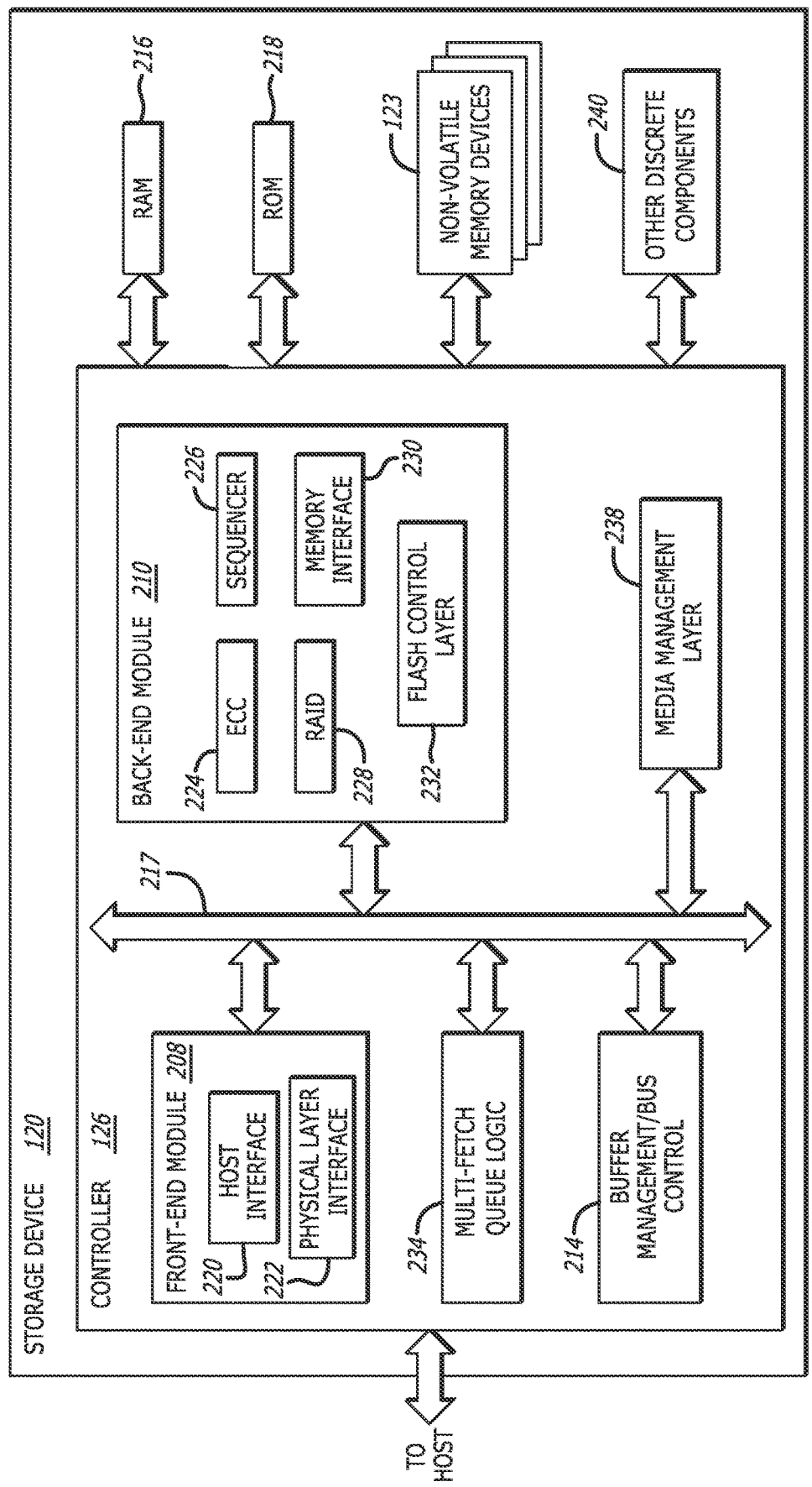
FIG. 2 is a schematic block diagram of a storage device suitable for write abort detections in accordance with an embodiment of the disclosure.

Referring to FIG. 2, a schematic block diagram of a storage device 120 suitable for pre-erase list usage in accordance with an embodiment of the disclosure. The controller 126 may include a front-end module 208 that interfaces with a host via a plurality of high priority and low priority communication channels, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as external electrical interfaces, external RAM, resistors, capacitors, or other components that may interface with controller 126. In alternative embodiments, one or more of the RAID modules 228, media management layer 238 and buffer management/bus control module 214 are optional components that may not be necessary in the controller 126.

Finally, the controller 126 may also comprise a multi-fetch queue logic 234. In many embodiments the multi-fetch queue logic 234 can be configured to facilitate the generation and execution of the multi-read process. Often, this can be done through the use of one or more memory pipeline instruction processing queues. These memory pipeline instruction processing queues can be generated by the multi-fetch queue logic 234 in response to determining the one or more multi-pass programming methods that can be utilized by the memory arrays within the storage device 120.

In certain embodiments, the multi-fetch queue logic 234 may operate as a module within the flash control layer 232 of the storage device 120. In further embodiments, the multi-fetch queue logic 234 may simply operate as part of the firmware of the controller 126. The multi-fetch queue logic 234 may modify previously existing queues to conform with a memory pipeline instruction processing queue order or it may take over or direct the processing, delivery, and execution of the various queues within a memory pipeline of the storage device 120.

As detailed below within the discussion of FIGS. 9-12, the multi-fetch queue logic 234 may direct the accessing and re-accessing of data within a host memory device to coincide with the delivery of data to the memory array in coordination with the multi-pass programming array being utilized. In this way, the additional accessing of data can alleviate the need for accessed data to reside in a memory array latch or within some temporary RAM or other lower-density memory array. In a variety of embodiments, the multi-fetch array can be utilized to work across multiple data pathways which can be directed through the use of multiple memory pipeline instruction processing queues. The use of multiple data pathways and memory pipeline instruction processing queues can be dynamically adjusted based on a variety of factors including, but not limited to, current storage device capacity, current data transfer speeds, and/or deployment specifications, etc.

Figure 3:
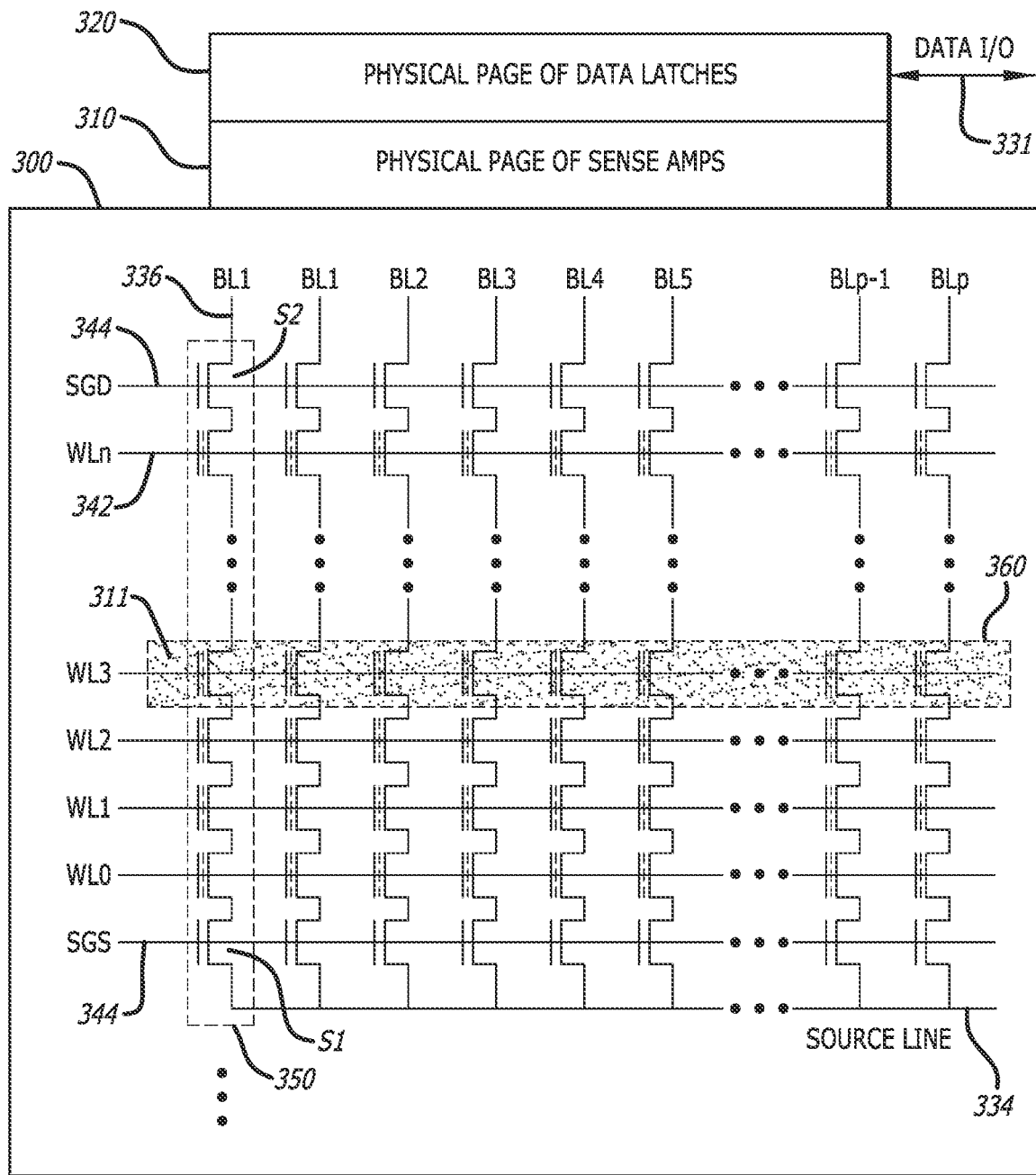
FIG. 3 is a conceptual illustration of a page of memory cells, organized for example in the NAND configuration, being sensed or programmed in parallel in accordance with an embodiment of the disclosure.

Referring to FIG. 3, a conceptual illustration of a page of memory cells, organized for example in the NAND configuration 300, being sensed or programmed in parallel in accordance with an embodiment of the invention is shown. FIG. 3 conceptually shows a bank of NAND strings 350 within a non-volatile memory device 123 of FIG. 1. A 'page' such as the page 360, is a group of memory cells enabled to be sensed or programmed in parallel. This is accomplished in the peripheral circuits by a corresponding page of sense amplifiers 310. The sensed results are utilized in latches within a corresponding set of data latches 320. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each memory cell such as memory cell 311 is accessible by a sense amplifier via a bit line 336. Data in the data latches 320 are toggled in from or out to the memory controller 126 via a data I/O bus 331.

The NAND string 350 can be a series of memory cells, such as memory cell 311, daisy-chained by their sources and drains to form a source terminal and a drain terminal respective at its two ends. A pair of select transistors S1, S2 can control the memory cell chain's connection to the external source via the NAND string's source terminal and drain terminal, respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory cell 311 in the chain acts to store a charge. It has a charge storage element to store a given amount of charge so as to represent an intended memory state. In many embodiments, a control gate within each memory cell can allow for control over read and write operations. Often, the control gates of corresponding memory cells of each row within a plurality of NAND strings are all connected to the same word line (such as WL0. WL1 . . . WLn 342). Similarly, a control gate of each of the select transistors S1, S2 (accessed via select lines 344 SGS and SGD respectively) provides control access to the NAND string via its source terminal and drain terminal respectively.

While the example memory device referred to above comprises physical page memory cells that store single bits of data, in most embodiments each cell is storing multi-bit data, and each physical page can have multiple data pages. Additionally, in further embodiments, physical pages may store one or more logical sectors of data. Typically, the host-computing device 110 (see FIG. 1) operating with a disk operating system manages the storage of a file by organizing the content of the file in units of logical sectors, which is typically in one or more units of 512 bytes. In some embodiments, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC, TLC, and QLC and other increased density structures, each cell can store 2, 3, 4 or more bits of data, and each physical page can store 16, 32, 64 or more logical sectors depending on the structure utilized.

One unique difference between flash memory and other types of memory is that a memory cell must be programmed from an erased state which is associated with no charge within the memory cell. This requires that the floating gate must first be emptied of charge prior to programming. Programming adds a desired amount of charge back to the floating gate. It does not support removing a portion of the charge from the floating to go from a more programmed state to a lesser one. Thus, new data cannot overwrite existing data and must be written to a previously unwritten or erased location. Furthermore, erasing all the charges from a floating gate can often take an appreciable amount of time. For that reason, it will be cumbersome and inefficient to erase cell by cell or even page by page. Therefore, in most embodiments, the array of memory cells is often divided into a large number of blocks. As is common in many flash-based memory systems, the block is the unit of erase. That is, each block contains the minimum number of memory cells that are erased in one action. This combined with the limited lifespans of memory cells within the flash memory increases the desire to limit the amount of erasing and programming occurring within the storage device.

Figure 4:
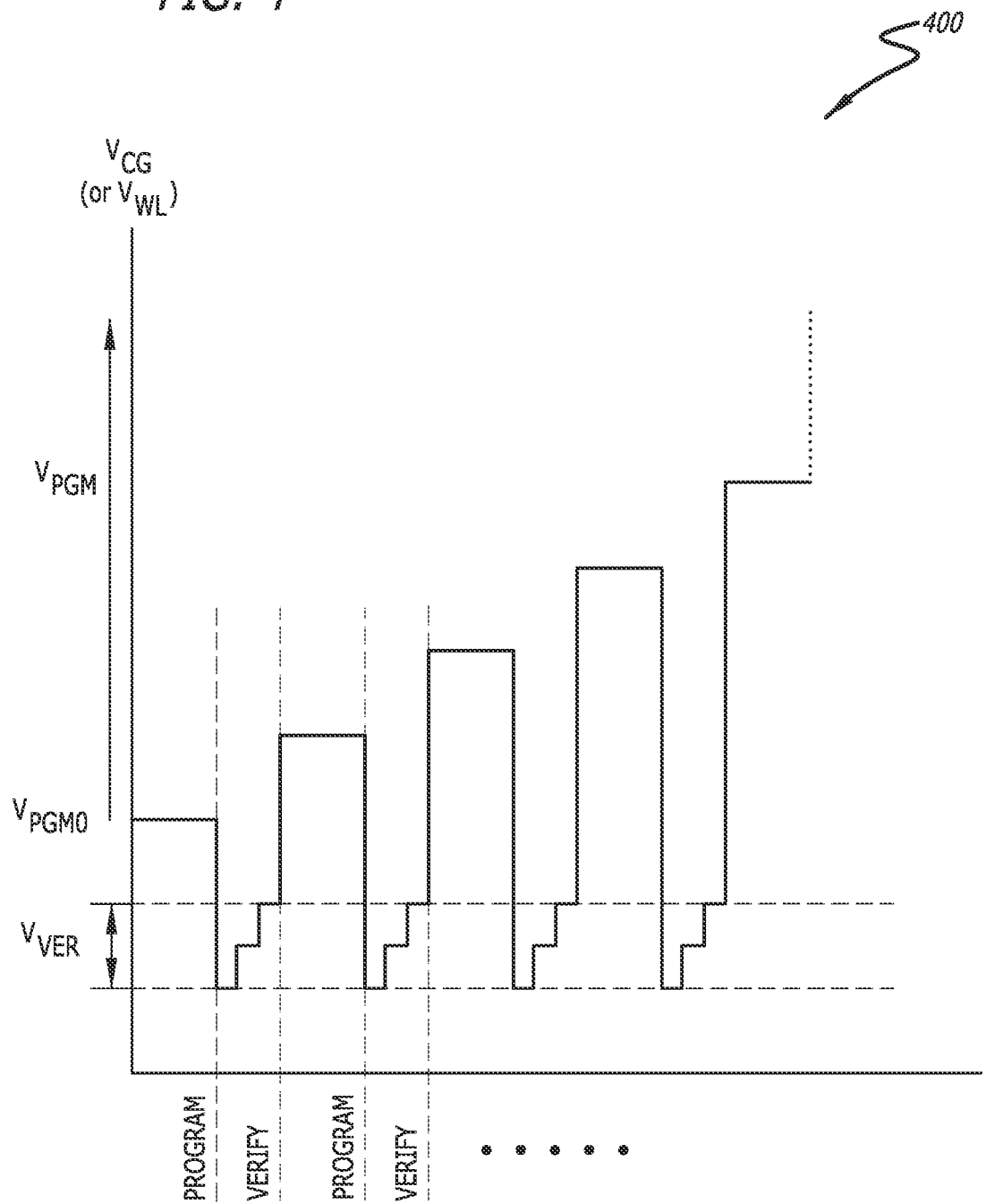
FIG. 4 is a conceptual illustration of a series of programming voltage pulses in the form of a staircase waveform being applied to a selected word line in accordance with embodiments of the disclosure.

Referring to FIG. 4, a conceptual illustration of a series of programming voltage pulses 400 in the form of a staircase waveform being applied to a selected word line in accordance with embodiments of the invention is shown. When a cell is programmed to a given state, it is often subject to successive programming voltage pulses to add incremental charges to the floating gate (seen within the "program" windows). In between programming pulses, the cell is often measured or verified to determine its source-drain current relative to a breakpoint level (seen within the "verify" windows).

In many embodiments, memory cell programming stops when it has been verified to reach the desired state ($V_{CG}$ or $V_{WL}$). The programming pulses used may have increasing period or amplitude in order to counter act the accumulating electrons programmed into the charge storage unit of the memory cell. The programming pulse level ($V_{PGM0}$) is often the initial pass and is then ramped up over successive programming passes through the program voltage levels ($V_{PGM}$). A pulse that moves more charge into a memory cell than another is said to be coarser while a pulse that moves less charge is considered to comprise a finer granularity. Memory cell programming circuits generally apply a series of programming pulses to a selected word line. In this way, a page of memory cells whose control gates are connected to the word line can be programmed together. Whenever a memory cell of the page has been programmed to its target state, it can become program-inhibited while the other cells continue to be subject to further programming until all memory cells of the page have been program-verified.

The charge programmed into the storage element of one memory cell produces an electric field that can perturb the electric field of neighboring memory cells. Generally, an erased cell has no charge in its floating gate and has roughly the lowest threshold voltage. As the memory cell is increasingly programmed with more charges into the floating gate, its associated threshold voltage increases. Memory cells generally operate within a range of threshold voltages, often called a threshold window. The threshold window can be partitioned into a plurality of subranges or bands of threshold voltages, each representing a memory state. For field-effect transistors with a floating gate, the charges programmed into the floating gate of a memory cell can determine its threshold voltage which in turn determines what memory state it is currently in. However, as the intercellular distance between memory cells is reduced, memory cells may begin to 'see' or otherwise be influenced by the charges programmed into the floating gates of its physical neighbors. Thus, a memory cell may register as having more charge than it actually has, creating a virtual effect that increases its threshold voltage.

If a memory cell is program-verified under a first field environment and later is read again under a second, different field environment created from neighboring cells being subsequently programmed with different charges, the read accuracy may be affected. This is what is referred to as the "Yupin Effect" which is a disturb due to a coupling between neighboring floating gates. With ever higher integration in semiconductor memories, the perturbation of the electric field due to the stored charges between memory cells becomes increasing appreciable as the inter-cellular spacing shrinks.

The Yupin effect can be mitigated by minimizing the asymmetry in field environment for a cell due to its neighbors, between the time the cell has finished program-verify (i.e. programmed to its target state) to the time when its neighbors have finished programming. In this way, when the cell is being program-verified at its target state, it sees a first field environment due to its neighbors, and subsequently with the completion of programming of its neighbors, it can see a second field environment, and the difference between these two field environments are minimized. Here, the Yupin effect manifests as a program disturb that affects adjacent cells along a row and across bit lines (BL-BL Yupin effect) and along a column across word lines (WL-WL Yupin effect) within a memory array.

One method to reduce BL-BL Yupin effect is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, the memory cells are programmed from the staging area to their final target destinations. In this way, the difference between the first and second field environment seen by a memory cell is due to the threshold voltages of its neighbors not moving across the full extent but at most across half of the threshold window.

A conventional method of implementing the above-mentioned multi-pass programming is performed as a series of binary programs, in which at each programming pass the threshold window is binary divided and memory cells with target states belonging to the upper half of the binary divisions are programmed to the lower middle portion of the binary divisions. Each further programming pass iterates the binary division programming until in a final programming pass all memory cells of the page are programmed to their final destinations. Another popular method of multi-pass programming is a foggy/fine method that utilizes coarser programming to set a rough approximation of the charges (foggy step) and then utilizes more granular programming pulses to refine the memory states within the threshold window until the data has been stored successfully (fine step).

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages can span through a threshold window. When the threshold window is partitioned into multiple sub-ranges or zones of threshold voltages, each resolvable zone can be used to represent a different memory state for a memory cell. The multiple memory states can be coded by one or more binary bits. In SLC memory, each memory cell stores one bit of data. In MLC, TLC, and QLC memory structures, each memory cell can store 2, 3 or 4 bits of data. It is contemplated that further increased memory structures may be utilized in response to novel methods of resolving smaller zones within threshold windows.

Figure 5:
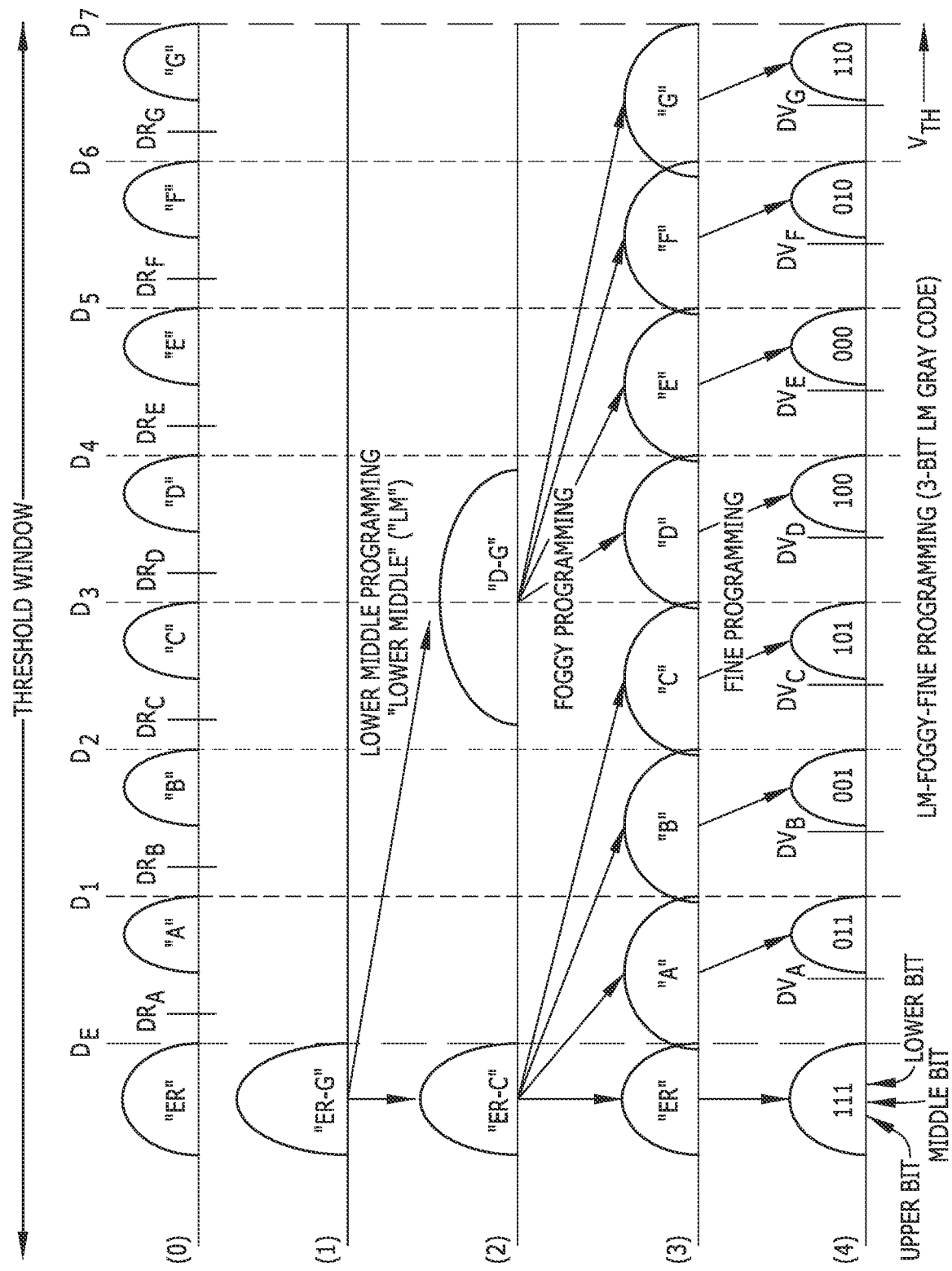
FIG. 5 is a conceptual illustration of a foggy/fine multi-pass programming scheme of a 3-bit memory cell in accordance with an embodiment of the disclosure.

Referring to FIG. 5, a conceptual illustration of a foggy/fine multi-pass programming scheme of a 3-bit memory cell in accordance with an embodiment of the invention is shown. FIGS. 5(0)-5(4) illustrate the programming of an 8-state memory programmed with a multi-pass foggy/fine programming method. Although this figure depicts a 3-bit TLC memory structure, it is contemplated and explained in more detail below that this method can be applied to QLC and other memory structures with higher bit densities per voltage threshold window. FIG. 5(0) illustrates the typical threshold voltage distributions of an 8-state memory array. The possible threshold voltages of each memory cell can span a threshold window which is partitioned in this embodiment into eight regions by demarcation threshold voltage points $D_E$-$D_7$ to demarcate respectively eight possible memory states, "Er", "A", "B", "C", "D", "E", "F" and "G". "Er" is a ground state, which is considered an erased state and "A"-"G" are seven progressively programmed states. During a read, the eight states are demarcated by seven demarcation read points, $DR_A$-$DR_G$.

FIG. 5(4) illustrates a representation of the eight possible memory states. Each of the eight memory states is represented by a triplet of "upper", "middle", and "lower" bits, namely "111", "011", "001", "101", "100", "000", "010 and "110" respectively. As is evident from FIG. 5(3), the final programming pass results in only a small change in the threshold voltages of all the memory cells. This translates to smaller changes in the charge stored within each memory cell, thereby minimizing the Yupin effect.

FIG. 5(1) indicates a memory cell that is suitable for programming via multi-pass foggy/fine programming. The "erased" state is labelled "Er-G" as it indicates that this threshold voltage may be increased to cover any of the potential voltage states within the memory cell. As shown in FIG. 5(2), after the first round programming, each cell remains in the "erased" or "Er" state if the lower bit is "1" or programmed to a "lower middle" ("LM") state if the lower bit is "0". In other words, the "Er" or "ground" state is the "erased" state with a tightened distribution by having the deeply erased states programmed to within a narrow range of threshold values. The "lower middle" states may have a broad distribution of threshold voltages that are straddled between memory states such as "B" and "D". During programming, the "lower middle" state can be verified relative to a coarse breakpoint threshold level such as D.

FIG. 5(3) illustrates that a second pass of a foggy/fine multi-pass programming method will program all the memory cells close to their destinations. These foggy voltage states include "Er" along with "A-G" as in FIG. 5(0). This second pass programming is referred to as "foggy" as it is still performed coarsely with coarse programming pulses to increase speed but is often finer than that of the first LM pass. This is typically followed by a third "fine" programming pass, as shown in FIG. 5(4), which trims the trailing edge of the threshold distribution of each state using still finer programming pulses. The verify threshold points for each pass can be dependent on the granularity of the programming pulses. Each placement is such that a memory cell will first be verified at the verify threshold before it can get over-programmed to a designated threshold value.

Since the fine programming only involves programming from within the proximity of the destination threshold voltage points, charges are not significantly altered from one round to another. This process helps to alleviate the BL-BL Yupin effect. As for 4-bit, 5-bit and higher bit foggy/fine multi-pass programming, the same principles can apply wherein an n-bit code would have n data pages with each page formed from every cell in a page contributing a given bit of the code. More importantly, programming from a lower (foggy) resolution to a higher (fine) resolution incurs moderate change in the charge of the cells, thereby limiting the amount of perturbation due to the Yupin effect among a page of memory cells.

It will be understood by those skilled in the art, that multi-pass programming typically includes multiple "passes" at each stage, and although FIG. 6 depicts 3 stages of programming, additional passes are often necessary for each stage. Indeed, in certain embodiments, programming a memory cell within either the foggy or fine step may require multiple, if not dozens of passes to achieve the proper voltage levels.

Referring to FIG. 6, a conceptual illustration of a staggered foggy/fine multi-pass programming order within a series of word lines with multiple strings in accordance with an embodiment of the invention is shown. As described previously, the Yupin effect may occur when changes in neighboring electric fields are made between readings of a memory cell. Various methods may be implemented to reduce these changes between programming and reading. FIG. 5 discussed the method of multi-pass programming utilizing a foggy and fine step that reduces changes between programming stages. Further reduction in field changes that may reduce WL-WL Yupin effects can include staggering the steps between foggy and fine programming among neighboring word lines as depicted in FIG. 6.

Typical multi-pass programming may attempt to sequentially program each cell and/or string by completing a fine programming pass directly after a foggy programming pass before moving onto another memory cell/string. However, by staggering the foggy and fine programming passes between memory strings and word lines, further reduction in neighboring field changes may be achieved.

FIG. 6 depicts a conceptual schematic of a storage device comprising a series of word lines, labeled WL0-WL95. Each word line includes 4 strings to be programmed (as STRINGS 0-3), and each string requires programming in both a foggy and fine stage. The staggered programming method depicted in FIG. 6 begins at STRING 0 on WL0 (0) which is programmed via one or more foggy programming passes. Instead of completing the fine programming pass of STRING 0 at WL0, the method instead continues to foggy program STRING 1 of WL0, followed by STRING 2 and STRING 3 of WL0 (1-3). At this stage of the method, all strings within WL0 are now foggy programmed. Instead of continuing to fine program each string within WL0, the method instead foggy programs STRING 0 of WL1 (4) before starting the fine programming of STRING 0 in WL0 (5). In this way, both of the nearest neighbors of STRING 0 of WL0 will have already had their foggy programming accomplished, thus reducing the potential changes to the electric field after fine programming which will further reduce the Yupin effect.

The method of programming depicted in FIG. 6 will continue to alternate between foggy programming further strings on WL1, and fine programming the remaining strings on WL0 (6-11). Once completed, the method will move on to begin alternating between foggy programming the strings on WL2, and fine programming the strings on WL1 (12-19). As shown in FIG. 6, the method will repeat the alternations between word lines for the remainder of the available word lines (20-767). As can be seen, when encountering the last word line, the method can simply finish the fine programming on the strings within the last word line (764-767).

Figure 7:
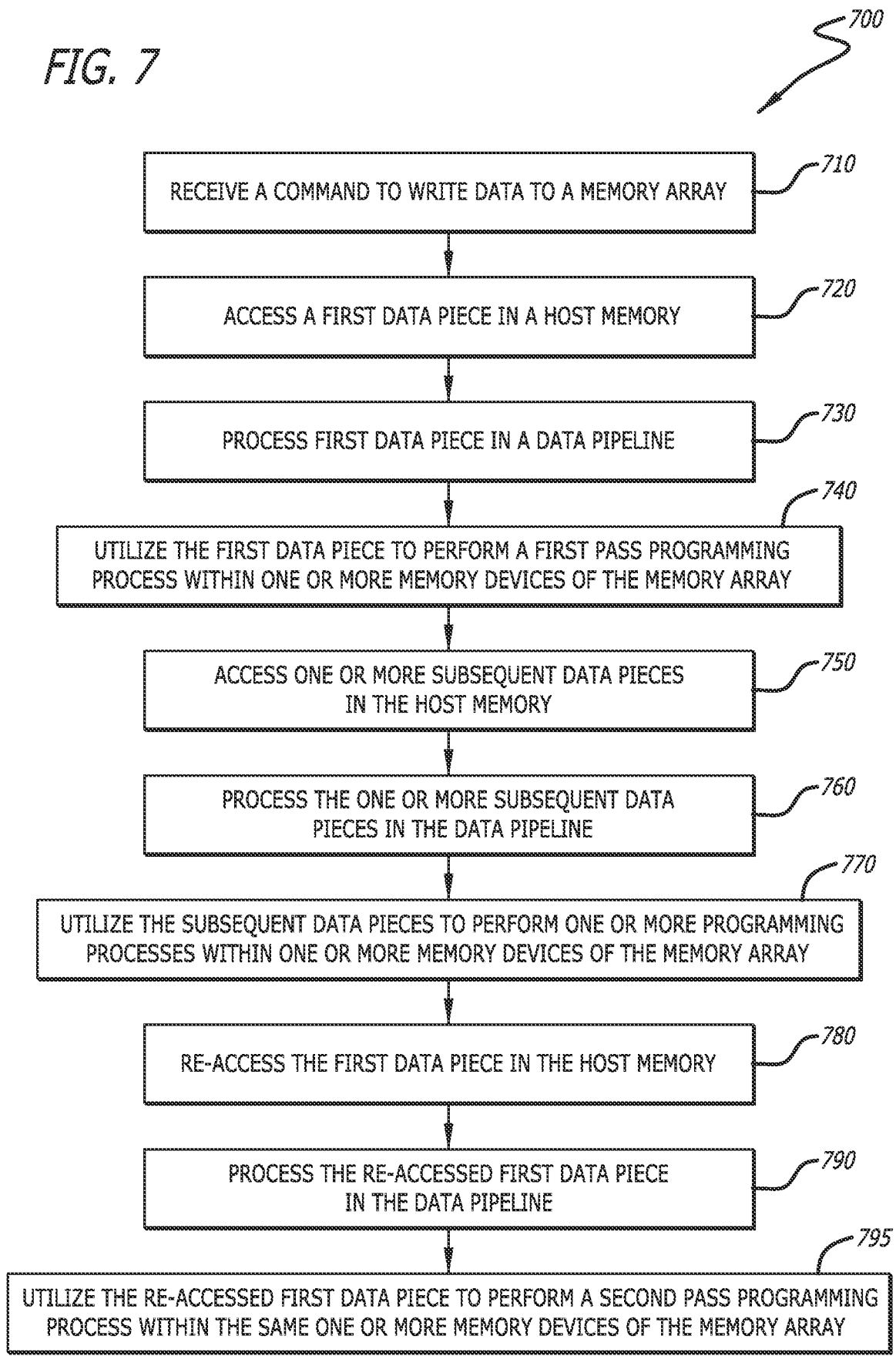
FIG. 7 is a flowchart depicting a process for fetching identical data multiple times during a write process in accordance with an embodiment of the disclosure.

Referring to FIG. 7, a flowchart depicting a process 700 for fetching identical data multiple times during a write process in accordance with an embodiment of the disclosure is shown. The process 700 can initiate in response to receiving a command to write data to a memory array (block 710). Often, this can be a host command received from a host computing device. The data to be written can be accessed in pieces. The process 700 can provide for accessing the host data to be written such as a first piece of data within the host memory (block 720). As described above, many embodiments access the data for storage in a memory array that is configured to be programmed in a multi-pass programming process. The accessed first data piece of memory can be used as a first (or "foggy") pass within the multi-pass programming process.

Once accessed, the first piece of data can be processed through a data (i.e., memory) pipeline (block 730). As described in the following figures, the pipeline can be utilized to pre-process accessed data prior to storage within the memory array. This may include, but is not limited to, encrypting the data, encoding it for improved retrieval, and/or formatting the data for presentation to the physical memory array. Once processed within the pipeline, the first data piece can be utilized to perform a first pass programming process within one or more memory devices of the memory array (block 740). It is contemplated that the size of the accessed data can be of varying size including bytes, strings, word lines, blocks, metablocks, etc. As highlighted in the discussion of FIG. 12, the exact size of accessed data can be scaled depending on the structure of the storage device and associated memory array(s).

Subsequent to the first data piece being accessed, the process 700 can access one or more different data pieces within the host memory (block 750). These subsequent data pieces can similarly be processed through the storage device pipeline utilized for pre-processing accessed data prior to presentation to the memory array (block 760). Once processed, the subsequent data pieces can be presented to and utilized by the memory array for performing one or more programming processes within one or more memory devices (block 770). In a number of embodiments, the subsequent data pieces will be unique and utilized to perform additional first pass programs within memory devices.

After the subsequent data pieces have been accessed, the process 700 can re-access the first piece of data within the host memory (block 780). In a variety of embodiments, re-accessing this first data piece will be accomplished by accessing the same location as the original accessing occurred. In some embodiments, this may be host data stored in one or more host buffers. In further embodiments, the re-accessed data is entirely identical to the original accessed data. This re-accessed data can be processed within the pipeline (block 790). In many embodiments, the re-accessed data will be identically pre-processed through the pipeline because it is the same data that was previously accessed. Because of its similarity to the originally accessed first piece of data, the re-accessed piece of data can be presented to and utilized by the memory array to perform a second pass programming process on the same memory devices that were programmed with the original first piece of data (block 795).

In a number of embodiments, the timing of accessing each piece of data can vary. As those skilled in the art will recognize, the timing, order, and/or amount of data accessed can be determined by the multi-pass programming order of the memory array. Different types of memory arrays can have unique programming orders to minimize negative effects such as those described previously. As such, the exact process of accessing data multiple times can vary, while still utilizing steps to re-access data with one or more other pieces of data accessed in between a first, second, or subsequent access.

Figure 8:
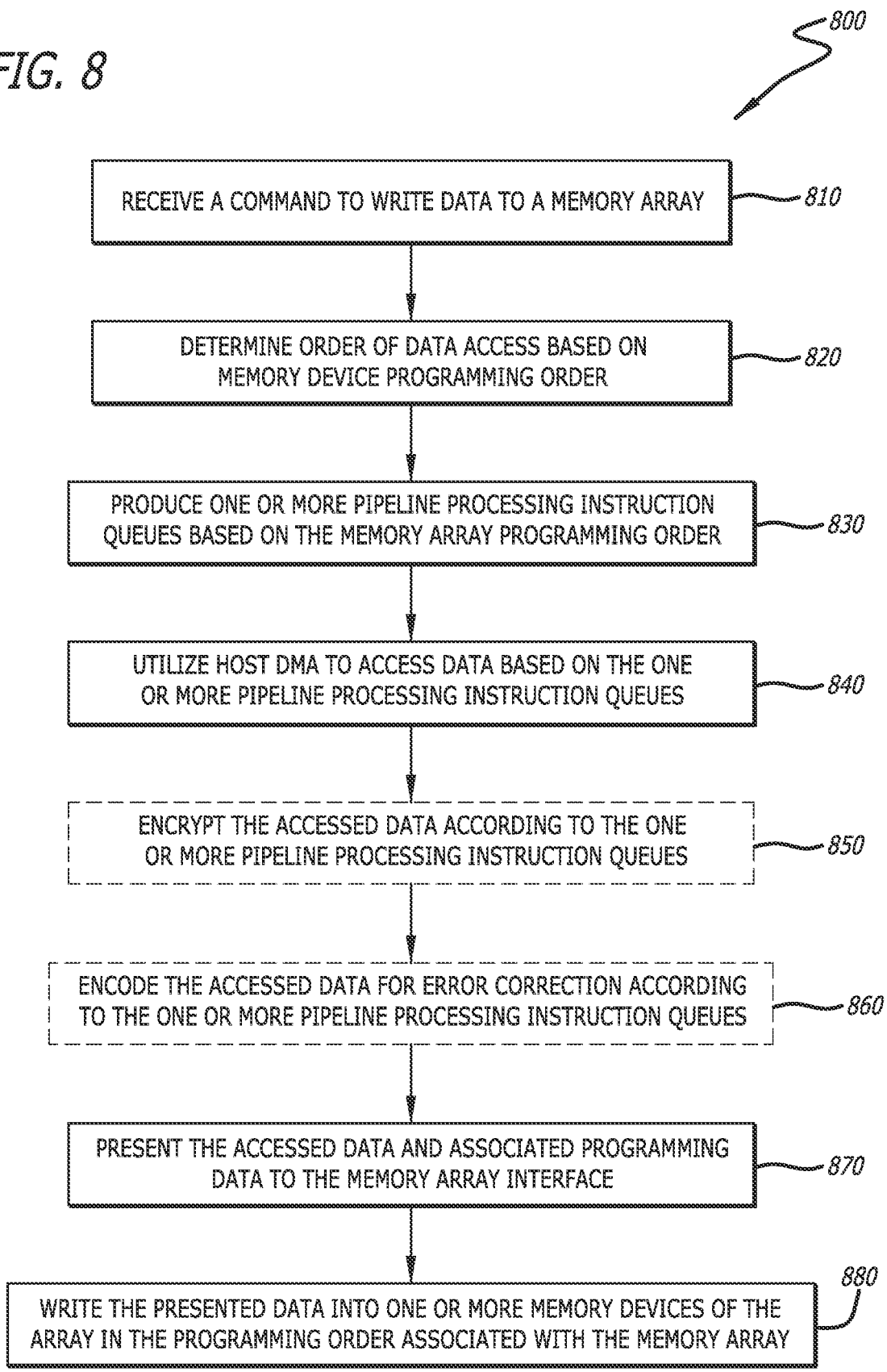
FIG. 8 is a flowchart depicting a process for retrieving data from a host and processing through a memory pipeline multiple times based on a predetermined programming order queue in accordance with an embodiment of the disclosure.

Referring to FIG. 8, a flowchart depicting a process 800 for retrieving data from a host and processing through a memory pipeline multiple times based on a predetermined programming order queue in accordance with an embodiment of the disclosure is shown. In many embodiments, the storage device will utilize a controller which operates a firmware or other operating system to direct flash control layer or other combination of hardware and software to read, process, and store data from a host computing device into the memory array. Various embodiments generate specialized pipeline processing instruction queues to facilitate the multi-fetch process described herein.

The process 800 can begin upon receipt of a command to write data to the memory array (block 810). The command can trigger the determination of which order to access the required data based on the memory device programming order (block 820). As described above, the memory devices within a memory array can be programmed utilizing a multi-pass programming method which can stagger or otherwise alter the timing of writing data such that multiple memory devices are written to in a interweaved fashion to minimize one or more negative effects. This non-sequential programming order can require the production of one or more pipeline processing instruction queues (block 830). As described below with reference to FIGS. 9-12, a pipeline processing instruction queue can be utilized to direct the reading of memory from a host multiple times while providing the required data to the memory for writing in the required programming order.

In a number of embodiments, the data to be stored is located within a host memory. The host memory can often be accessed by utilizing a host direct memory access (DMA) feature based on the one or more pipeline processing instruction queues that are being utilized by the storage device (block 840). In some embodiments, a host DMA may not be available, leaving the data to be accessed through traditional methods of host interactions. It is also contemplated that certain methods of data access may be utilized that allow quick access to the data within the host that are not DMA may be utilized.

In some embodiments, the processing of the accessed data may include encrypting the data (block 850). The order of what data to encrypt can be done in response to the direction of the one or more pipeline instruction queues. Likewise, certain pipelines may further encode the data for error correction based on the one or more pipeline processing instructions queues (block 860). Various embodiments may include other pre-processing steps not described herein.

Once processed through the pipeline, the accessed data can be presented to the memory array interface along with one or more associated programming instruction data (block 870). In certain embodiments, the memory array may be interchangeable within the storage device, which can be accounted for by providing a memory array interface which can accept various data and programming instructions, interpret them, and process them to actual instructions that the memory array can act on. Once presented, the data can be written to one or more memory devices within the array in the appropriate programming order (block 880).

Figure 9:
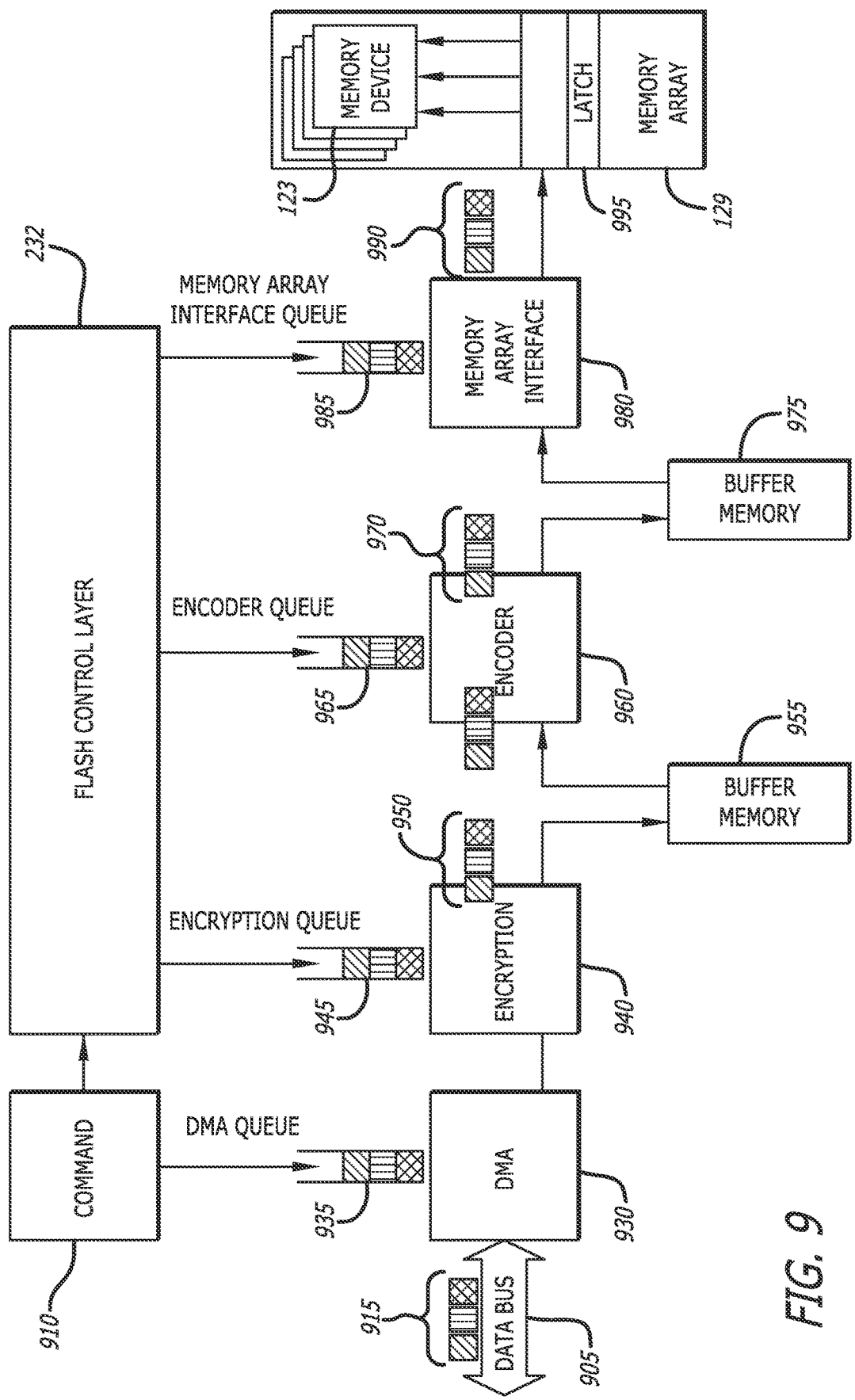
FIG. 9 is a conceptual illustration of data being processed through a memory pipeline in accordance with an embodiment of the disclosure.

Referring to FIG. 9, a conceptual illustration of data being processed through a memory pipeline in accordance with an embodiment of the disclosure is shown. A command 910 is presented that is sent to the flash control layer 232 of the storage device. The command 910 may provide pointers or other data that may be placed within or create a DMA access queue 935. This DIA access queue 935 can include instructions or pointers to what data should be retrieved next. In some embodiments, the DMA access queue is created and/or operated by the flash control layer 232.

A DMA access device 930 can read in data from the DMA access queue 935 which allows the DMA access device 930 to utilize one or more data busses 905 to fetch one or more pieces of data 915. As described above, many embodiments include the DMA accesses queue 935 which is ordered based on a pipeline instruction processing queue. Once fetched, the data 915 can be passed to an encryption engine 940 if one is present within the storage device. The encryption engine 940 can be configured to process data based on an encryption queue 945 which can be generated and/or operated by the flash control layer 232. The resulting encrypted data 950 can be stored within a first buffer memory 955 until it is needed for further processing within the pipeline.

Various embodiments of storage devices will further encode data prior to storage. This is often done to format the data in a way that will allow for easier error/read correction when the data is accessed in the future. This process can be done by adding in extra data during an encoding process. An encoder 960 can retrieve data from the first buffer memory 955 and generate encoded data 970 which may then be stored within a second buffer memory 975. As with other components of the memory processing pipeline, the encoder can be directed to which data to process in what order based on the instructions within the encoder queue 965. The encoder queue 965 is also operated by the flash control layer 232.

Once encoded, the encoded data 970 may be retrieved from the second buffer memory 975 and presented to the memory array interface 980. The memory array interface 980 can access, process, and present data based on the received instructions from the memory array interface queue 985. In many embodiments, the flash control layer 232 will include not only the order of data to process within the memory array interface queue 985, but also the specific programming instructions for each piece of data within the memory array interface queue 985. In certain embodiments, the memory array interface 980 can include multiple flash-based interface modules wherein one module receives and process data from the memory array interface queue 985 while another module retrieves data from the second buffer memory 975 based on instructions from the first module.

The memory array ready data 990 processed by the memory array interface 980 can be delivered or otherwise directed to the non-volatile memory array 129 (shown as "memory array") for storage. In a number of embodiments, the non-volatile memory array 129 can first take the memory array ready data 990 and store it intermediately within one or more latches 995. Although the embodiment in FIG. 9 depicts the latches 995 separate from the non-volatile memory devices 123 various embodiments may be configured to have the latches 995 situated within the memory devices 123. Once ready for storage within one or more non-volatile memory devices 123 (shown as "memory devices"), the memory array ready data 900 can be read from the one or more latches 995 and written to one or more non-volatile memory devices 123 within the non-volatile memory array 129. This process may be completed multiple times for the same piece of data when utilizing a multi-pass programming process. An example of how specific pieces of data can be processed multiple times within a pipeline is described in more detail below.

Figure 10:
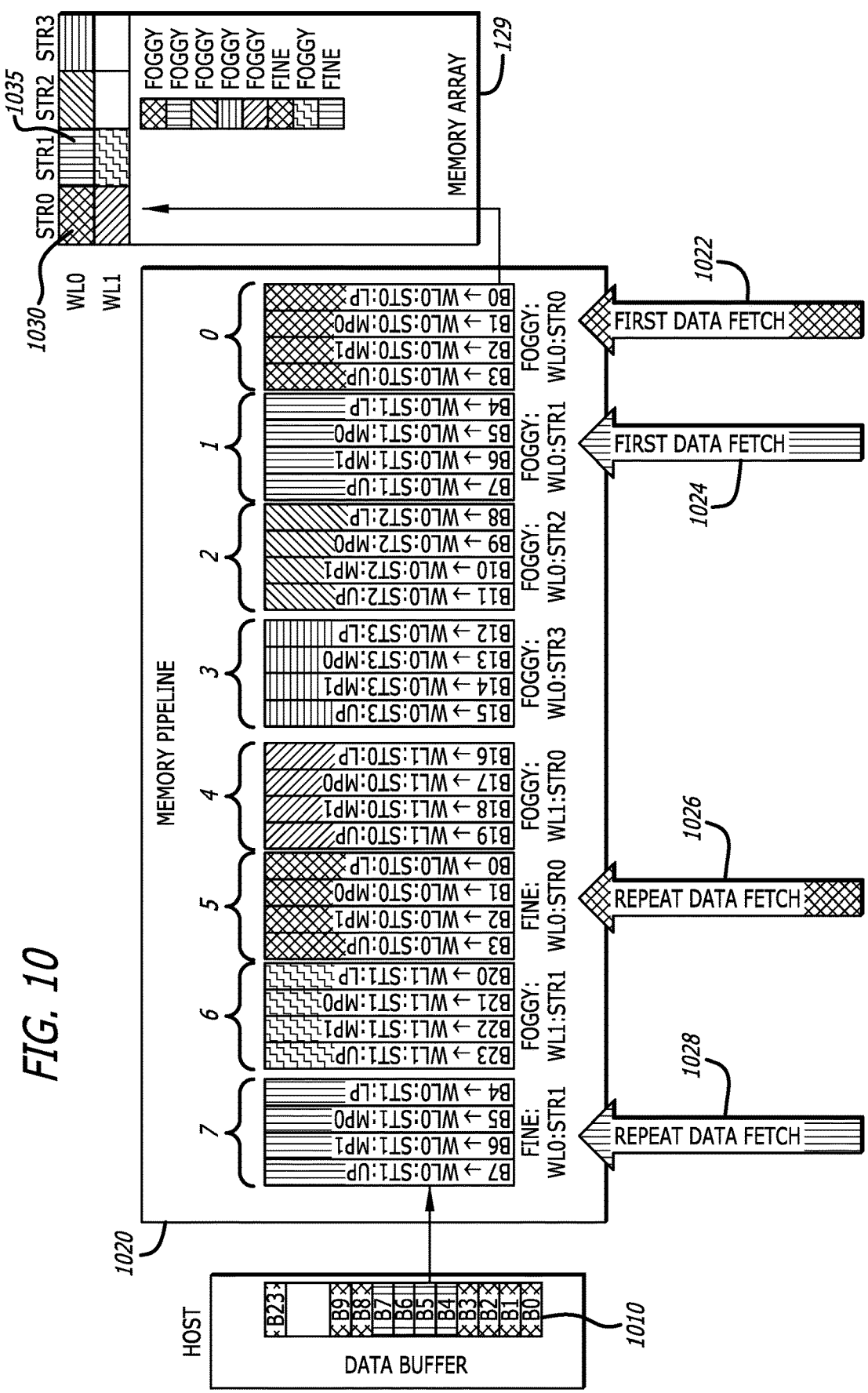
FIG. 10 is a conceptual illustration of a memory pipeline instruction processing queue in accordance with an embodiment of the disclosure.

Referring to FIG. 10, a conceptual illustration of a memory pipeline instruction processing queue in accordance with an embodiment of the disclosure is shown. A host data buffer 1010 can be read from to write data within a non-volatile memory array 129. A memory pipeline instruction processing queue can indicate a particular order to access and process data within a memory pipeline 1020 such that data may be presented to the non-volatile memory array 129 in a way that adheres to an expected programming order while avoiding the use of internal memory to store sequential or single-fetch methods.

The embodiment depicted in FIG. 10 conceptually illustrates how data can be written to a non-volatile memory array 129 (shown as "memory array") in an order similar to the foggy/fine programming order that is illustrated within FIG. 6. In FIG. 6, the arrows indicated that programming would occur along strings 0-3 in word line 0 (WL0) first in a foggy programming step. This would be followed up by an interweaved pattern of performing a foggy step programming of a string in word line 1 (WL1) and then a fine step programming of a string in word line 0 (WL 0). The steps of this process are labelled 0 through 11 to highlight the sequential programming order of the various strings and word lines. The step numbers 0 through 11 can correspond to the data pieces accessed within FIG. 10 where steps 0 through 7 are shown within the memory pipeline 1020.

The memory pipeline instruction processing queue utilized in FIG. 10 can be organized based on the known programming order of the non-volatile memory array 129. String 0 in word line 0 (the first memory block 1030) of the non-volatile memory array 129 will be first to be programmed, followed by the second memory block 1035 and so forth. In response, the memory pipeline instruction processing queue can access the first pieces of data (B0-B3) necessary for the first (foggy) programming pass. This first data fetch 1022 (shown as group 0) will be processed along the memory pipeline 1020 and presented to the non-volatile memory array 129 for storage. The memory pipeline instruction processing queue can then determine that the first data fetch 1024 (shown as group 1) will be accessed within the host data buffer 1010 as B4 through B7 and be written as the first (foggy) programming pass for the second memory block 1035.

The memory pipeline instruction processing queue will then direct the storage device to access further host data buffer 1010 B8-B19 in order to program strings 2 and 3 of word line 0 (WL0) and string 0 of word line 1 (WL1) of the non-volatile memory array 129 (shown as groups 2-4). Subsequently, the memory pipeline instruction processing queue will then re-access the host data buffer 1010 to retrieve data pieces B0 through B3 (shown as group 5) as a repeat data fetch 1026 for the second (fine) programming step of the first memory block 1030 within the non-volatile memory array 129. The memory pipeline instruction processing queue will then process the interweaved pattern as discussed above wherein each subsequent group of data pieces will switch between programming a first (foggy) programming step on a string within word line 1 (WL1) and programming a second (fine) step within a string of word line 0 (WL0). Specifically, within the embodiment depicted in FIG. 10, the memory pipeline instruction processing queue will next acquire data pieces B20-B23 (shown as group 6) for a first (foggy) programming step of string 1 of word line 1 (WL1) followed by another repeat data fetch 1028 of data pieces B4-B7 (shown as group 7) to complete programming of the second memory block 1035.

As stated above, the embodiment of FIG. 10 is shown as a conceptual illustration to better highlight aspects of the disclosure. It is contemplated that any suitable multi-pass programming method may be utilized within a storage device and may benefit from one or more embodiments described herein. Likewise, data may be written into any number of sizes and data pieces may be fetched in different groupings based on the programming required within the non-volatile memory array 129. For example, the data pieces depicted in FIG. 10 correlate to lower, middle, and upper bit programming within one or more memory devices. Other memory devices may be programmed in various other methods and require more, fewer, or different types of instructions to write data. It will also be recognized by those skilled in the art that the actual accessed data may be read as entire data and not as data pieces which may be processed within the pipeline, only to partitioned into pieces or have memory array programming instructions appended at the final step when presenting the data to a memory array interface. An example of how this type of memory pipeline instruction processing queue can be utilized within a memory pipeline is shown below.

Figure 11:
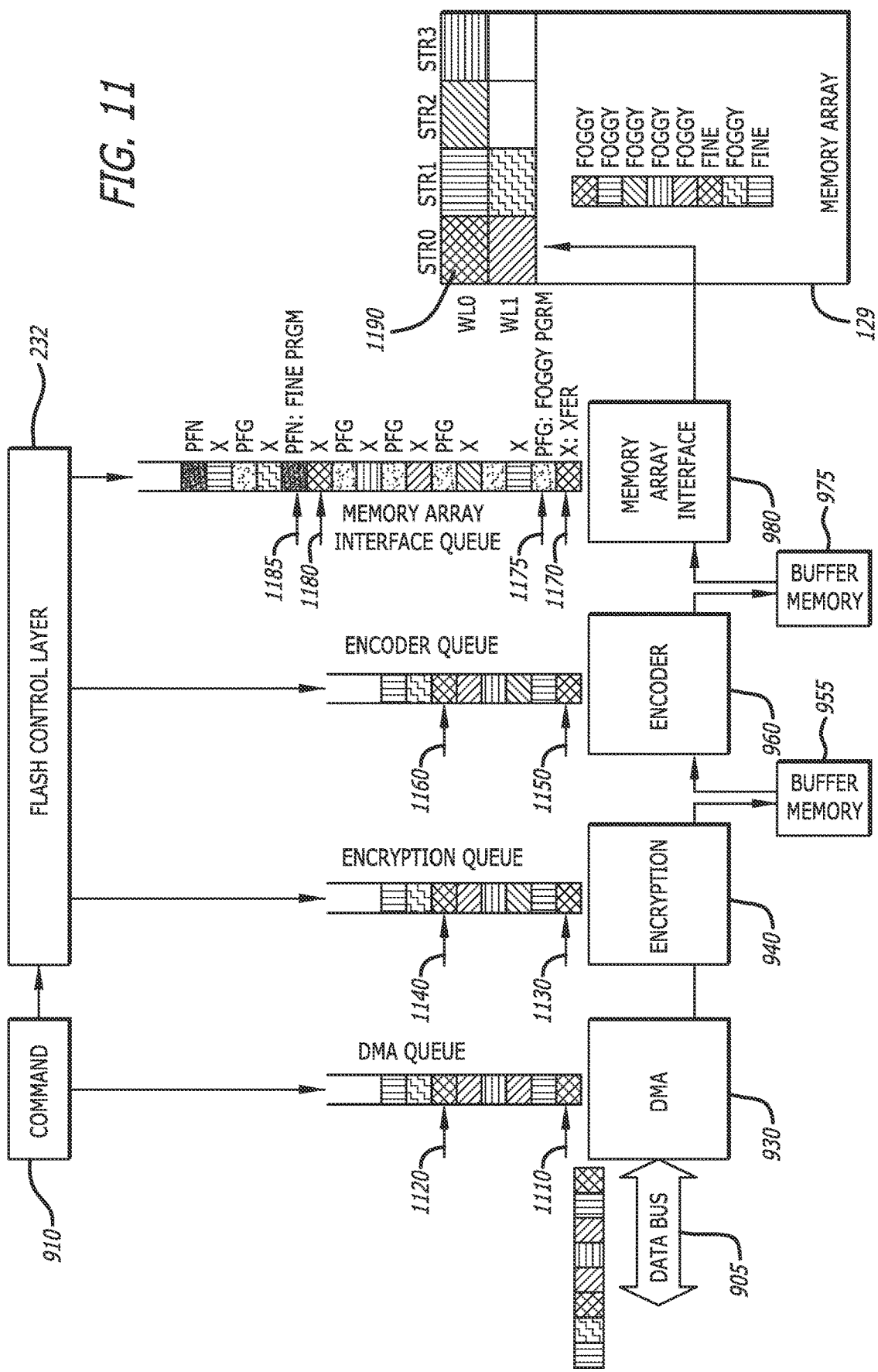
FIG. 11 is a conceptual illustration of a memory pipeline processing data utilizing a memory pipeline instruction processing queue in accordance with an embodiment of the disclosure.

Referring to FIG. 11, a conceptual illustration of a memory pipeline processing data utilizing a memory pipeline instruction processing queue in accordance with an embodiment of the disclosure is shown. This embodiment is similar to the embodiment depicted in FIG. 9 in that data is processed through a pipeline prior to storage within a non-volatile memory array 129 (shown as "memory array").

In particular, the embodiment depicted in FIG. 11 is processing data utilizing an order generated by a memory pipeline instruction processing queue. Based on this, various data pieces are accessed multiple times based on the programming order required by the non-volatile memory array 129.

A command 910 may be received that indicates that data should be written to the non-volatile memory array 129. The command may include one or more pointers to the host memory where the desired data is located. These pointers or other indicators may be added to a DMA queue for processing by a DMA access device 930 through one or more data bus(es) 905. However, in various embodiments, the specific order of data to be fetched in the DMA queue may be adjusted or otherwise configured to specifically order the data for retrieval in a specific order. For example, a first memory block 1190 may require two passes of programming to be fully programmed. This would require the presentation of data twice to the non-volatile memory array 129 if there were not sufficient latches within the non-volatile memory array 129 to temporarily store the data prior to subsequent programming passes. The memory pipeline instruction processing queue may determine that the data to be written to the first memory block 1190 should be retrieved (i.e., fetched) twice. The queue for accessing data may be configured to provide for a first data access instruction 1110 and a second data access instruction 1120.

The DMA queue can direct the DMA access device to retrieve the data and pass it to an encryption engine 940 if present within the storage device. The flash control layer 232 may be directed by or may in some embodiments process and generate the memory pipeline instruction processing queue to add the first data access instruction 1130 and a second data access instruction 1140 within the encryption queue. Once processed through the encryption engine 940, the encrypted data can be stored within a first buffer memory 955 prior to being accessed by the encoder 960. The encoder 960 can encode the data associated with the first data access instruction 1150 and second data access instruction 1160 of the encoder queue and store it within a second buffer memory 975.

Subsequent to being encoded, the flash control layer 232 can configure the memory array interface queue to include not just a first data access instruction 1170 and second data access instruction 1180 (configured to access the data in the second buffer memory 975) but may also include a first data programming instruction 1175 (shown as PFG (i.e., "program foggy")) and a second data programming instruction 1185 (shown as PFN (i.e., "program fine")). In this way, the flash control layer 232 can construct a memory array interface queue to not only provide the location of what data to access next but may also provide one or more instructions to indicate how that data is going to be programmed within the non-volatile memory array 129. In the embodiment depicted in FIG. 10, the first data programming instruction 1175 indicates that the data associated with the first data access instruction 1170 should be programmed using a foggy (first) programming pass, while the second data programming instruction 1185 indicates that the data associated with the second data access instruction 1180 should be programmed utilizing a fine (second) programming pass. It is contemplated that some embodiments may not provide programming instructions within a queue but may have the non-volatile memory array 129 or memory array interface determine and instruct the programming of each accessed data piece.

Figure 12:
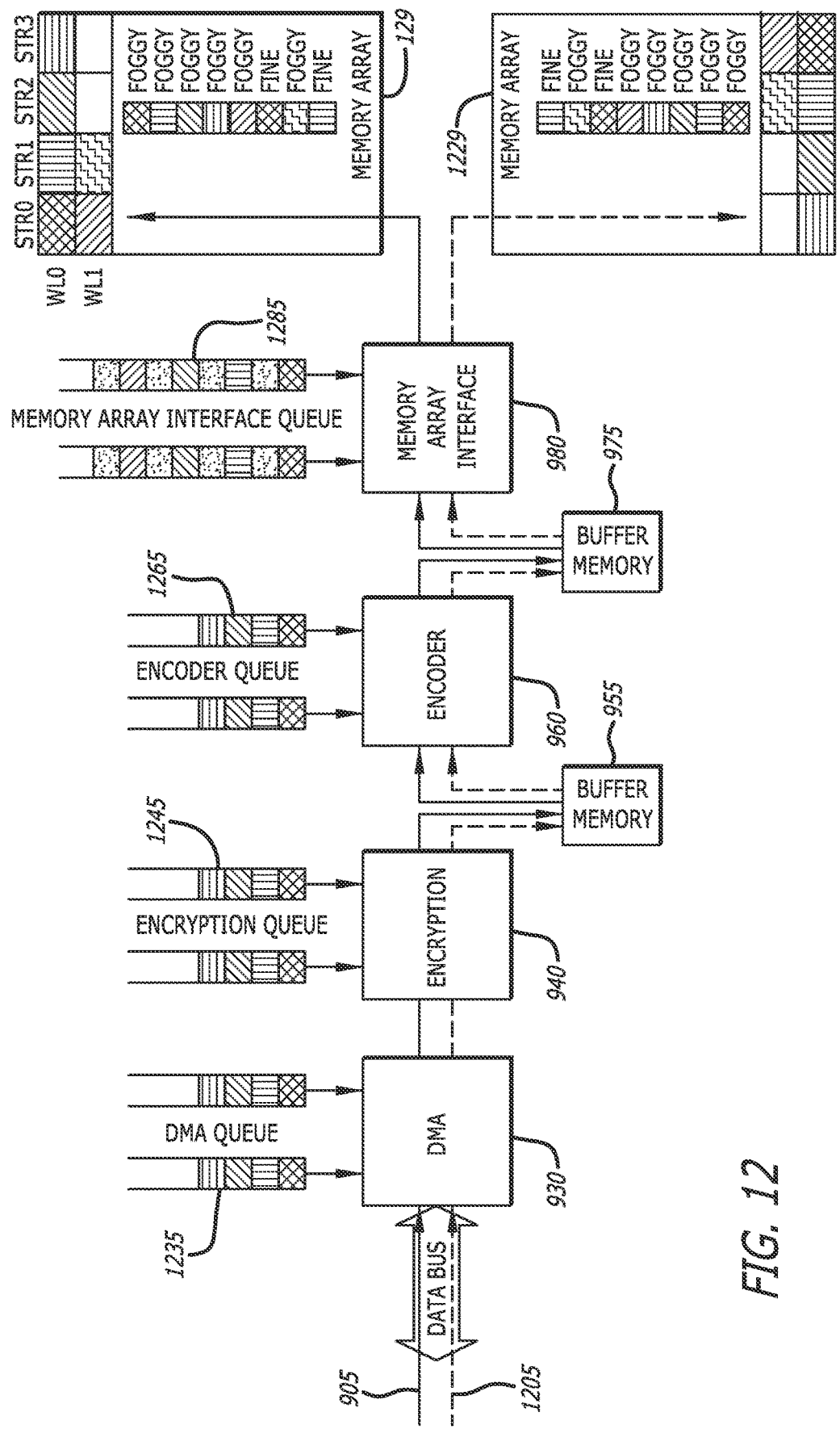
FIG. 12 is a conceptual illustration of a plurality of memory pipelines processing data utilizing a plurality of memory pipeline instruction processing queues in accordance with an embodiment of the disclosure.

Referring to FIG. 12, a conceptual illustration of a plurality of memory pipelines processing data utilizing a plurality of memory pipeline instruction processing queues in accordance with an embodiment of the disclosure is shown. The previous embodiments of the disclosure have depicted a single memory array and a single memory pipeline with a single data bus to a host. However, as computing devices, storage devices, and memory arrays become more complex, many embodiments exist where multiple data paths can be utilized. Indeed, the number of data bus pathways, queues, and memory arrays that can utilize aspects of the disclosure are only limited by the available technology. The embodiment depicted in FIG. 12 shows a memory pipeline that utilizes multiple pathways for data to be accessed, processed, and stored within multiple non-volatile memory arrays 129, 1229 (shown as "memory array") within a storage device.

In fact, the embodiment depicted in FIG. 12 is similar to the embodiment depicted in FIG. 11 but includes a second data bus pathway 1205 to access host data, along with a plurality of secondary memory pipeline queues 1235, 1245, 1265, 1285 to process twice as much data in parallel which can then be stored within a second memory array 1229 in a similar fashion as the original non-volatile memory array 129. To save on costs, many embodiments utilize a single DMA access device 930, encryption engine 940, encoder 960, memory array interface 980 and first and second buffer memory 955, 975. In a variety of embodiments, the increased use of additional memory pipeline instruction processing queues is directly related to an increase in the number of dies available on a storage device (i.e., increased die parallelism).

The storage device can generate a plurality of memory pipeline instruction processing queues to match the available data buses 905, 1205. Each memory pipeline instruction processing queue can be configured independently for each memory array 129, 1229 or can be processed together and divided based on available resources and/or known capacities of the memory arrays 129, 1229. The generated memory pipeline instruction processing queues are then utilized to facilitate the order and timings of the secondary memory pipeline queues 1235, 1245, 1265, 1285. In a number of embodiments, each step within the memory pipe can be configured with a simple scheduler to service each of the available queues. A non-limiting example of a simple scheduler may include a round-robin scheduler. This configuration of dual fetching of data along multiple data lines can allow for the access and use of multi-pass programming in larger and more complex data storage systems without the need for additional temporary storage memory within the host computing device or storage device.

Further embodiments can dynamically adjust the use and processing of the memory pipeline instruction processing queues based on various factors including, but not limited to, the deployment specifications of the storage device, current data command conditions, memory array capacity, number of connected hosts, current processing resources available within the storage device, etc. It is also contemplated that other memory structures can be processed similarly within the embodiments depicted above including, for example, memory metablocks. The entire disclosure herein is not limited to memory blocks, word lines, strings, or bits. For example, a memory pipeline instruction processing queue may be configured to direct accessing, re-accessing, and/or processing of larger units of data including multiple blocks of data potentially across multiple hosts and stored across a plurality of parallel memory dies at once.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent, to those of ordinary skill in the art, are also encompassed by the present disclosure.

What is claimed is:

1. A device comprising:
a processor;
a memory array comprising:
a plurality of memory devices configured to be programmed with a multi-pass programming method; and
a multi-fetch queue logic configured to:
receive a command to write host data to the memory array;
initially access a first piece of data from a host computing device;
process the first piece of data within a memory pipeline prior to programming within the memory array;
subsequently access a second piece of data from the host computing device;
process the second piece of data within the memory pipeline;
utilize the processed first piece of data within the memory pipeline for a first programming pass of one or more memory devices within the memory array;
intermediately store the processed first piece of data in one or more latches communicatively coupled to the plurality of memory devices, wherein the one or more latches are located outside the plurality of memory devices, and wherein if the one or more latches do not have space, the multi-fetch queue logic is configured to present the processed first piece of data to the memory array twice;
utilize the processed second piece of data within the memory pipeline for the first programming pass of the one or more memory devices within the memory array;
re-access the first piece of data within the host computing device;
process the re-accessed first piece of data within the memory pipeline; and
utilize the re-accessed first piece of data to perform a second programming pass of the one or more memory devices within the memory array;
wherein processing the first piece of data comprises:
encrypting the first piece of data and temporarily storing the encrypted first piece of data in a first buffer memory; and
encoding the encrypted first piece of data and temporarily storing the encrypted and encoded first piece of data in a second buffer memory; and
wherein processing the second piece of data comprises:
encrypting the second piece of data and temporarily storing the encrypted second piece of data in the first buffer memory; and
encoding the encrypted second piece of data and temporarily storing the encrypted and encoded second piece of data in the second buffer memory.

2. The device of claim 1, wherein the multi-pass programming method is a two pass programming method.

3. The device of claim 2, wherein the two pass programming method is a foggy-fine programming method.

4. The device of claim 1, wherein the pieces of data are accessed through a host direct memory access (DMA) process.

5. The device of claim 1, wherein the processing of data within the memory pipeline is based on a memory pipeline instruction processing queue.

6. The device of claim 5, wherein an order of accessing the data is directed by one or more instructions within memory pipeline instruction processing queue.

7. The device of claim 6, wherein a determination of the order of data access within the memory pipeline instruction processing queue is generated by the multi-fetch queue logic.

8. The device of claim 1, wherein any number of subsequent pieces of data may be accessed prior to subsequently accessing the first piece of data.

9. A device comprising:
a processor;
a memory array comprising:
a plurality of memory devices; and
a multi-fetch queue logic configured to:
receive a command to write host data to the memory array;
determine a programming order of the memory array;
produce a pipeline processing instruction queue and a plurality of programming instructions based on the determined programming order of the memory array, wherein the programming order of the memory array requires at least two passes of programming;
access the host data based on the pipeline processing instruction queue, wherein the host data is accessed at least two times;
process, through a data pipeline, the accessed host data based on the pipeline processing instruction queue;
intermediately store the processed host data in one or more latches communicatively coupled to the plurality of memory devices, wherein the one or more latches are located outside the plurality of memory devices, and wherein if the one or more latches do not have space, the multi-fetch queue logic is configured to present the processed host data to the memory array twice;
present the processed host data and the plurality of programming instructions to a memory array interface; and write the processed host data to the memory array in an order indicated by the programming instructions;
wherein processing the host data comprises:
encrypting the host data and temporarily storing the encrypted host data in a first buffer memory in the data pipeline; and
encoding the encrypted host data and temporarily storing the encrypted and encoded host data in a second buffer memory in the data pipeline.

10. The device of claim 9, wherein the programming of data within the memory array is a foggy-fine programming method.

11. The device of claim 10, wherein the programming instructions include foggy-fine programming instructions for specific parts of the data within the host data.

12. The device of claim 9, wherein the memory array is a quad level cell (QLC) memory array.

13. The device of claim 9, wherein processing the processed host data through the data pipeline includes encrypting the processed host data.

14. The device of claim 9, wherein processing the processed host data through the data pipeline includes encoding the processed host data with error correction data.

15. The device of claim 9, wherein processing the processed host data through the data pipeline includes processing the data through one or more memory array interfaces.

16. A method of writing data to a storage device, comprising:
receiving a command to write host data to the memory array;
determining a multi-pass programming order of the memory array;
producing one or more pipeline processing instruction queues and a plurality of programming instructions based on the determined programming order of the memory array;
accessing the host data on two or more data buses based on the one or more pipeline instruction processing queues, wherein the host data for each data bus is accessed at least two times;
processing, through a single data pipeline, the accessed host data based one or more on the pipeline processing instruction queues, wherein the processing is scheduled between two or more queues;
intermediately storing the accessed host data in one or more latches communicatively coupled to the plurality of memory devices, wherein the one or more latches are located outside the plurality of memory devices, and wherein if the one or more latches do not have space, the accessed host data are presented to the memory array twice;
presenting the processed host data and the plurality of programming instructions to a memory array interface; and
writing the host data to one or more memory arrays in an order indicated by the programming instructions;
wherein processing the host data comprises:
encrypting the host data and temporarily storing the encrypted host data in a first buffer memory in the single data pipeline; and
encoding the encrypted host data and temporarily storing the encrypted and encoded host data in a second buffer memory in the single data pipeline.

17. The method of claim 16, wherein the scheduling is handled by a simple scheduler.

18. The method of claim 16, wherein the two or more data buses correlate to two or more planes of memory dies within the storage device.

\* \* \* \* \*